United States Patent [19]

Thabit

[11] Patent Number: 5,081,412
[45] Date of Patent: Jan. 14, 1992

[54] CURRENT CONDUCTION PROBE CIRCUIT

[76] Inventor: Abdullah A. Thabit, 5601 Penn Ave., Apt. C 62, Pittsburgh, Pa. 15206

[21] Appl. No.: 525,835

[22] Filed: May 18, 1990

[51] Int. Cl.⁵ .............................................. H03K 3/33
[52] U.S. Cl. .................................. 324/126; 324/133; 307/317.1
[58] Field of Search ................ 307/317.1; 324/133, 324/149, 158, 126

[56] References Cited

U.S. PATENT DOCUMENTS

| | | | |
|---|---|---|---|
| 2,835,867 | 5/1958 | Golden | 307/317.1 |
| 3,183,309 | 5/1965 | Hunt | 307/317.1 |
| 3,283,073 | 11/1966 | Campbell | 307/317.1 |
| 3,621,285 | 11/1971 | Anderson | 307/317.1 |
| 4,011,507 | 3/1977 | Rossell | 324/133 |
| 4,210,862 | 7/1980 | Koslar | 324/149 |
| 4,297,632 | 10/1981 | Glaser et al. | 324/133 |
| 4,366,434 | 12/1982 | Ellis | 324/149 |
| 4,584,526 | 4/1986 | Lobastov | 324/133 |
| 4,924,177 | 5/1990 | Mulz | 324/133 |

OTHER PUBLICATIONS

*Digital Integrated Electronics*, Taub and Schilling, 1977, pp. 451–454.

Primary Examiner—David Hudspeth
Assistant Examiner—Scott A. Ouellette

[57] ABSTRACT

A current conduction element otherwise known as a majed circuit comprising a first PN junction. The majed circuit is also comprised of a second PN junction connected in parallel with the first PN junction but which is biased oppositely therefrom. The first and second PN junctions share common connection points such that current flows through the majed circuit in a first direction through the first PN junction but not through the second PN junction, and current flows in the majed current circuit in a second direction through the second PN junction but not through the first PN junction.

2 Claims, 1 Drawing Sheet

CURRENT CONDUCTION PROBE CIRCUIT

FIELD OF THE INVENTION

The present invention is related to electronic apparatuses. More specifically, the present invention is related to an electronic apparatus which is comprised of a first diode, and a second diode in parallel with the first diode but biased oppositely therefrom.

BACKGROUND OF THE INVENTION

Electrical equipment is powered with current. Accordingly, knowledge of current at a given location in electrical equipment is vital. Heretofore, current detectors, such as ampmeters, require a prior knowledge of the direction of current flow.

The present invention provides for the detection of current flow regardless of the polarity of the flow with the assistance of a common ampmeter.

SUMMARY OF THE INVENTION

The present invention pertains to a bidirectional circuit. The bidirectional circuit comprises a first PN junction. The majed circuit is also comprised of a second PN junction connected in parallel with the first PN junction but which is biased oppositely therefrom. The first and second PN junctions share common connection points such that current flows through the bidirectional circuit in a first direction through the first PN junction but not through the second PN junction, and current flows in the bidirectional circuit in a second direction through the second PN junction but not through the first PN junction.

BRIEF DESCRIPTION OF THE DRAWINGS

In the accompanying drawings, the preferred embodiments of the invention and preferred methods of practicing the invention are illustrated in which.

DESCRIPTION OF THE PREFERRED EMBODIMENT

Figure 1:
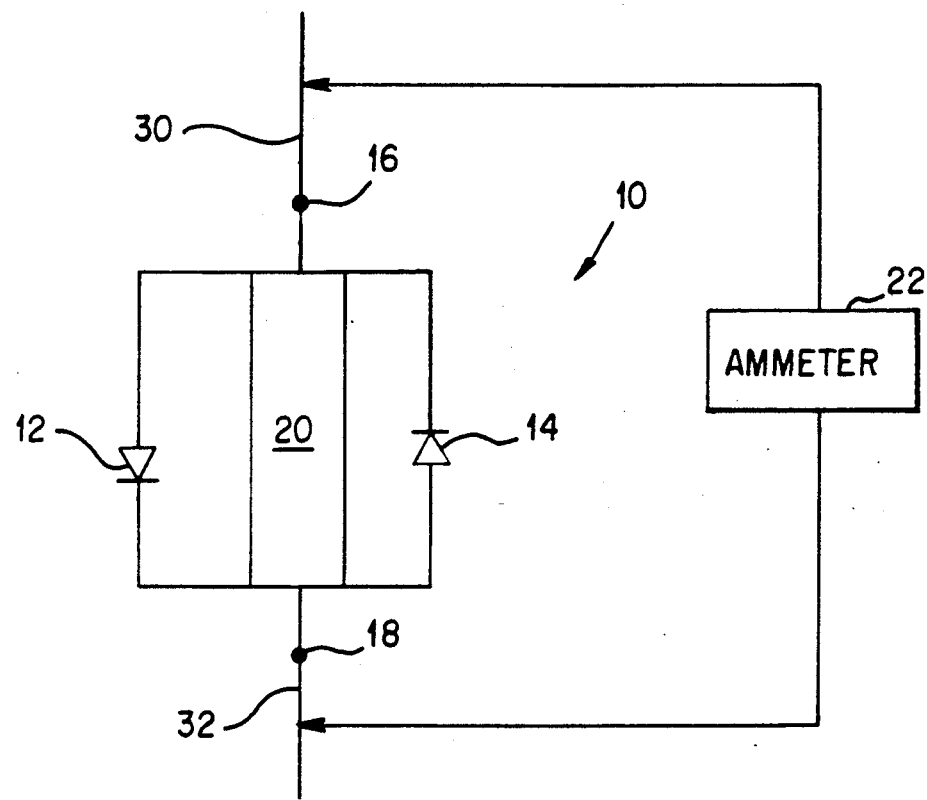
FIG. 1 is a schematic representation of the present invention.

Referring now to the drawings wherein like reference numerals refer to similar or identical parts throughout the several views, and more specifically to FIG. 1 thereof, there is shown a schematic representation of a bidirectional circuit 10. The bidirectional circuit 10 can measure current in a circuit without cutting the circuit in any way. The bidirectional circuit 10 is comprised of a first PN junction, such as a first diode 12. The bidirectional circuit 10 is also comprised of a second PN junction, such as a second diode 14, connected in parallel with the first diode 12 but which is biased oppositely therefrom.

Preferably, there is an electrical insulation layer 20 disposed between the first diode 12 and second diode 14. The layer 20 can be, for instance, air, with the diodes 12, 14 spaced apart far enough, depending on the situation, that they are essentially electrically isolated from each other.

The first diode 12 and the second diode 14 share common connection points 16, 18 such that current flows through the bidirectional circuit 10 in a first direction through the first diode 12 but not through the second diode 14, and current flows through the bidirectional circuit 10 in a second direction through the second diode 14 but not through the first diode 12. Preferably, the first diode 12 and second diode 14 are encased in electrically insulating material for protection. The first diode 12 and the second diode 14 have a rating that corresponds to an environment they are used in. Essentially, the bidirectional circuit 10 can be used for any wattage amounts with the appropriately rated diodes.

Preferably, there is an electrical insulation layer 20 disposed between the first diode 12 and second diode 14. The layer 20 can be, for instance, air, with the diodes 12, 14 spaced apart far enough, depending on the situation, that they are essentially electrically isolated from each other.

By the bidirectional circuit 10 having a first diode 12 in parallel with a second diode 14 but which is biased oppositely therefrom, then current always has a path to pass therethrough, regardless of direction. Whether it be a DC current where the current flows over time in only one direction, or an AC current where current direction is constantly alternating, the current can always pass through the bidirectional circuit 10 since current can pass through in both directions, albeit one direction at a time.

Since the bidirectional circuit 10 through its diodes 12, 14 provides resistance to a current path, an voltammeter 22 placed on the current path on each side of the connection point 16, 18 can detect the current therethrough as well as the direction of the current therethrough. It is not necessary to have a priori knowledge of the direction of current flow or the polarity thereof to effectively use the voltammeter.

In the operation of the preferred embodiment, a first diode 12 and a second diode 14, both model ECG ®- 5800, are connected in parallel but oppositely biased between a wire 30 and a wire 32. Current flowing from wire 32 to wire 30 passes through diode 14 but not through diode 12. Current flowing from wire 30 to wire 32 passes through diode 12 but not through diode 14. Air between diode 12 and diode 14 acts as electrical insulation therebetween.

An voltammeter 22 with one lead placed on wire 30 and another lead placed on wire 32 registers 0.6 amps when the current is subject to a load.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A current probe for a circuit including a load, comprising:
   a first probe point;
   a second probe point;
   a first PN junction; and
   a second PN junction;
   said first and second PN junctions connected in parallel between said first and second probe points and poled to conduct current in opposite directions between said first and second probe points in said current probe;
   one of said first and second probe points connected to said load so that the current probe is connected in series with said load in said circuit;
   wherein during normal operation of said circuit, said circuit probe allows current to flow uninterrupted to said load in said circuit, and during test operation of said circuit, connection of an ammeter to said first and second probe points allows the magnitude and direction of current to said load in said circuit to be ascertained.

2. A current probe as described in claim 1, wherein the first PN junction is a first diode, and the second PN junction is a second diode.

* * * * *